United States Patent

Calvin

(10) Patent No.: US 6,507,283 B1
(45) Date of Patent: Jan. 14, 2003

(54) SELF-VALIDATING OUTPUT MODULE

(75) Inventor: James Calvin, Mansfield, MA (US)

(73) Assignee: The Foxboro Company, Foxboro, MA (US)

( * ) Notice: Subject to any disclaimer, the term of this patent is extended or adjusted under 35 U.S.C. 154(b) by 0 days.

(21) Appl. No.: 09/314,519

(22) Filed: May 19, 1999

Related U.S. Application Data

(60) Provisional application No. 60/086,102, filed on May 20, 1998.

(51) Int. Cl.[7] .............................................. G08B 21/00
(52) U.S. Cl. ...................... 340/644; 340/664; 340/687; 361/159
(58) Field of Search ................................ 340/635, 664, 340/645, 644, 686.1, 687; 361/159

(56) References Cited

U.S. PATENT DOCUMENTS

| | | | |
|---|---|---|---|
| 3,708,784 A | 1/1973 | Spencer | 340/147 R |
| 3,936,705 A | 2/1976 | Billion | 317/136 |
| 4,134,025 A | 1/1979 | Levin | 307/125 |
| 4,357,804 A | 11/1982 | Beitner | 62/3 |
| 4,485,342 A | 11/1984 | Hill et al. | 323/351 |
| 4,495,655 A | 1/1985 | Benson et al. | 455/603 |
| 4,654,545 A | 3/1987 | Giordano | 307/350 |
| 4,670,812 A | 6/1987 | Doerfler et al. | 361/83 |
| 4,758,739 A | 7/1988 | Ovens et al. | 307/289 |
| 4,760,472 A | 7/1988 | Minuhin et al. | 360/46 |
| 4,763,017 A | 8/1988 | Campbell et al. | 307/262 |
| 4,777,479 A | 10/1988 | Hinckley | 340/644 |
| 4,847,728 A * | 7/1989 | Youla | 340/645 |
| 4,962,350 A | 10/1990 | Fukuda | 323/283 |
| 5,068,545 A | 11/1991 | Molnar | 307/311 |
| 5,258,654 A | 11/1993 | Roberts et al. | 307/125 |
| 5,341,029 A | 8/1994 | Johnson | 307/112 |
| 5,392,440 A | 2/1995 | Marten | 395/775 |
| 5,404,318 A | 4/1995 | Hoffert et al. | 364/551.01 |
| 5,444,264 A | 8/1995 | Heinonen et al. | 250/559.29 |
| 5,444,644 A | 8/1995 | Divjak | 364/550 |
| 5,446,370 A | 8/1995 | Voight | 324/76.11 |
| 6,198,405 B1 * | 3/2001 | Andersson et al. | 340/815.45 |

FOREIGN PATENT DOCUMENTS

| | | | |
|---|---|---|---|
| DE | 29606029 | 5/1997 | H04L/25/06 |
| GB | 1219262 | 1/1971 | H03K/19/00 |

* cited by examiner

*Primary Examiner*—Daniel J. Wu
(74) *Attorney, Agent, or Firm*—Kevin A. Oliver; Foley Hoag LLP

(57) ABSTRACT

A self-validating output module in a control system includes a current detector and an operating component having at least two states. When the operating component is in the first state, current is directed away from a current detector and toward a load. When it is in its second state, current is directed toward the current detector and away from the load. The presence or absence of current on the current detector is thus a status signal indicative of whether or not current is being supplied to the load. This status signal is then made available to a controller.

37 Claims, 5 Drawing Sheets

SELF-VALIDATING OUTPUT MODULE

This application relates to the field of process control systems, and in particular, to methods and apparatus for verifying the operation of an output module connected to an actuator in a process control system. This application claims priority from U.S. Provisional Application No. 60/086,102, filed May 20, 1998, the contents of which are incorporated herein by this reference.

BACKGROUND

In an industrial process, it is often desirable to maintain the value of a process parameter, referred to as the controlled variable, at a particular setpoint value. The controlled variable is typically controlled by adjusting the value of another process parameter referred to as a manipulated variable. For example, in a nuclear power plant, one controlled variable is the temperature of the circulating coolant, and one manipulated variable is the extent to which neutron absorbing rods penetrate the reactor core to slow down the nuclear reaction responsible for raising the temperature.

The task of correctly adjusting the value of a manipulated variable, in order to control the value of a controlled variable, most often falls on a feedback control system associated with the industrial process. In a feedback control system, a sensor measures the value of the controlled variable and provides that value to a controller. On the basis of the difference between the measured value of the controlled variable and the setpoint, the controller determines the value of the manipulated variable required to bring to zero the difference between the controlled variable and the setpoint.

Once the controller determines the desired value of the manipulated variable, it transmits a control signal to drive the value of the manipulated variable towards that desired value. Almost invariably, this control signal results in the operation of a switch associated with a process actuator. For example, in the case of the nuclear power plant, the controller may transmit a control signal that closes a relay switch. This relay switch then connects a power supply to a load, such as an electric motor that moves the neutron absorbing rods into the reactor core in order to slow the reaction.

In many cases, the control signal does not close the switch directly. This is because controllers are typically low power digital devices primarily intended for information processing and not for providing the power required to operate large relay switches. In these cases, the controller transmits a control signal to an output module whose function is to connect the relay switch to a power supply having sufficient power to drive the relay switch. An output module can thus be considered as an actuator for the actuator.

It is possible, of course, for a controller to operate flawlessly, but for an operating component within either the output module or the actuator to fail. For example, a switch within the output module may fail to open or close in response to the control signal. Alternatively, the power supply for driving the load may fail. Either of these failures will eventually be manifested by measured values of the controlled variable that are grossly inconsistent with the control signal. This inconsistency can prompt the controller to generate an alarm. The disadvantage of detecting a failure in this manner is that there is often such a lengthy delay before the seriousness of the situation becomes apparent that by the time the problem is known, it is already too late to do anything about it.

It is known to provide a self-validating output module in which a series resistance is placed between a load, for example a relay switch, and a power supply. The voltage across the series resistor can then be measured by a differential amplifier, the output of which is made available to the controller. The presence or absence of a voltage across the series resistor in this type of output module indicates whether or not the switch connecting the load to the power supply is open or closed. If the switch is closed, a voltage drop proportional to the drawn current will exist across the series resistor. Conversely, if the switch is open, no voltage drop (or a negligible voltage drop due to leakage current, in the case of a transistor switch) will exist across the series resistor.

A disadvantage of the foregoing self-validating output module is the additional cost and complexity associated with providing a differential amplifier with its own power supply. A more serious disadvantage is that this type of self-validating output module cannot readily verify that the power supply is ready and able to provide the necessary power to the load. This is because a lack of voltage across the series resistor is consistent with both an open switch in conjunction with a working power supply, and an open switch in conjunction with a malfunctioning power supply. It is only when the switch is closed that one can determine, on the basis of the voltage across the series resistor, whether the power supply can deliver.

What is necessary in the art therefore is a self-validating output module having simplicity of construction and the ability to identify a malfunctioning power supply.

SUMMARY OF THE INVENTION

The invention provides a self-validating output module that includes an operating component that operates in either a first state or a second state. When operating in the first state, the operating component directs current towards a current detector and away from a load. Conversely, when operating in the second state, the operating component directs current away from the current detector and towards the load. This self-validating output module further includes a signal generator responsive current in the current detector. In response to the presence or absence of current in the current detector, this signal generator generates a status signal indicative of whether the operating component is operating in the first state or in the second state. This status signal can be available to a controller. If the status signal indicates a malfunction, the controller can then immediately alert a human operator.

In one embodiment of a self-validating output module according to the invention, the operating component is a switch having a first state in which it directs current from a power supply to a load and having a second state in which it directs current from the power supply to the current detector. Typically, the load is a relay switch for changing a manipulated variable of a controlled process. The load can be either within the output module itself, but is most commonly associated with a process actuator outside the output module.

In a preferred embodiment, the current detector is a unidirectional current carrier such as a diode. The output of the diode is electrically coupled to the control terminal of a transistor so that the presence or absence of current in the current detector results in the presence or absence of a conducting path between two other terminals of the transistor.

If electrical isolation of the output module is desired, the diode can be a light-emitting diode optically coupled to the control terminal of a transistor operating in the manner described above. The combination of a light-emitting diode optically coupled to a transistor is known in the art as an optoisolator and is frequently used in applications in which electrical isolation is desired between a sensor and a sensed parameter.

If communication of the status signal across a network is desirable, the output module can further include a processor in communication with a network. In this embodiment, the processor executes instructions for transforming the output of a logic circuit into a message suitable for transmission on a network.

The operating component can also be a power supply connected to a load. In such an embodiment, the power supply has a first state in which it supplies sufficient power to drive the load, and has a second state in which it fails to provide sufficient power to drive the load. In this embodiment, a self-validating output module according to the invention enables the controller to verify that the power supply is ready and able to supply power to the load. This ability to determine the output of the power supply, without actually connecting the power supply to the load, can be further enhanced by providing a voltage detector configured to detect voltage in excess of a threshold required to operate the load. Such a voltage detector can be implemented as a zener diode in series with a current detector and having a breakdown voltage selected to permit reverse conduction through the zener diode when the power supply generates a voltage in excess of the desired threshold.

The invention also includes a method of transmitting a status signal to a process controller that indicates the status of an operating component within an output module. The method includes the step of directing current to a current detector and away from a load when the operating component is in a first state and directing current and directing the current to the load and away from the current detector when the operating component is in the second state. The presence or absence of current in the current detector is thus indicative of the whether the operating component is in the first state of the second state. The method further includes the step of generating a status signal on the basis of whether there exists current in the current detector.

These and other features of the invention will be further apparent in connection with the following detailed description and the accompanying figures, in which:

DETAILED DESCRIPTION

Figure 1A:
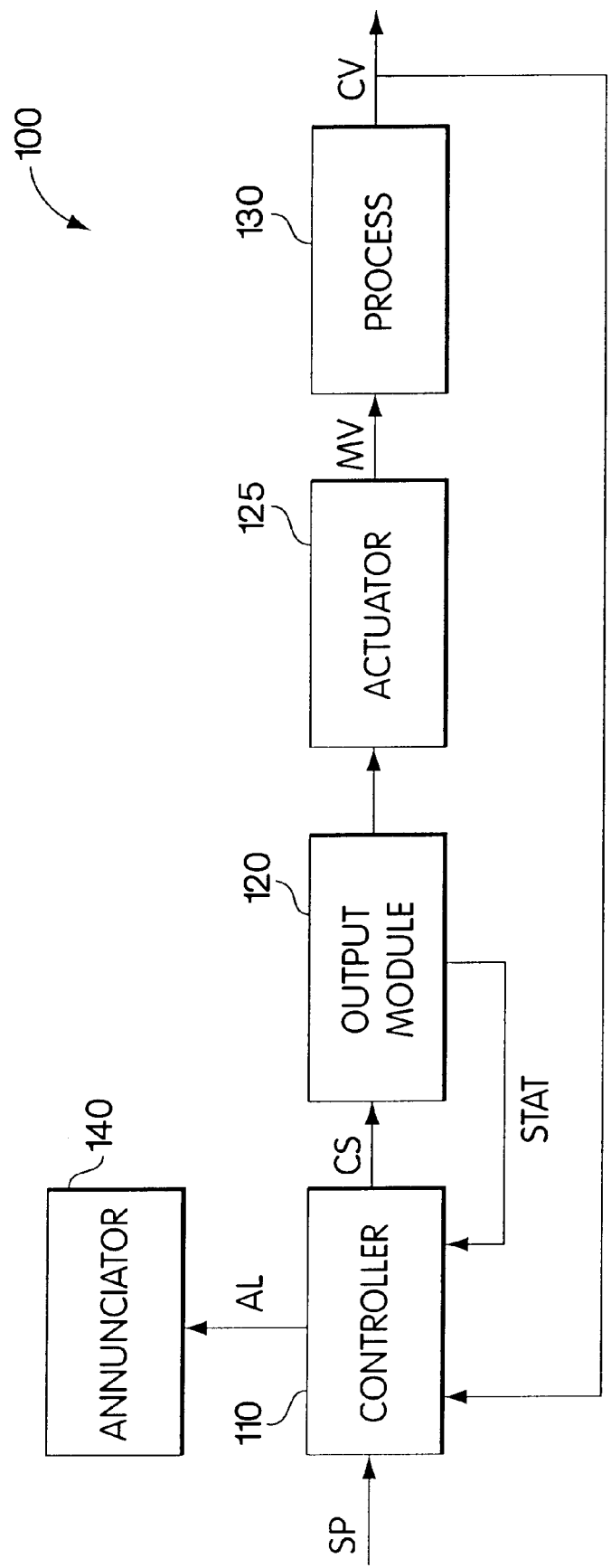
FIG. 1A shows a self-validating output module according to the invention in a feedback control system.

FIG. 1A shows a control system 100 incorporating a self-validating output module 120 according to the invention. The control system includes a controller 110 in communication with both the output module 120 and an annunciator panel 140 visible to a human operator. The output module 120 is connected to an actuator 125 coupled to a process 130 to be controlled.

In operation, the controller 110 obtains a measured value of the controlled variable cv from the process 130 and compares that measured value to a desired setpoint value sp obtained externally as shown or, alternatively, stored within the controller 110. On the basis of this difference, the controller 110 transmits a control signal cs to the output module 120 instructing the output module 120 to change a manipulated variable mv. The output module 120 drives the actuator 125 that changes the manipulated variable and communicates that change to the process 130. In response to the change in the manipulated variable, the process 130 undergoes a change that results in a change in the controlled variable.

It is possible that, as a result of an internal malfunction, the output module 120 may not respond to the control signal correctly. Although the lack of response in the controlled variable will eventually alert the controller 110 to the possibility of an internal malfunction in the output module 120, there are disadvantages associated with relying on such a mechanism for detecting an internal malfunction in the output module 120. One disadvantage is that a delay between the change in the manipulated variable and the resulting change in the controlled variable may be inherent in the process 130 under control. During this delay, considerable damage may occur.

To remedy this, the output module 120 provides a status signal stat to the controller 110 to indicate the status of one or more operating components within the output module 120. If the controller 110 detects a status signal indicative of a malfunction in one or more of the operating components within the output module 120, the controller 110 transmits an alarm signal al to an annunciator panel 140 visible to a human operator who can then take appropriate action.

Figure 1B:
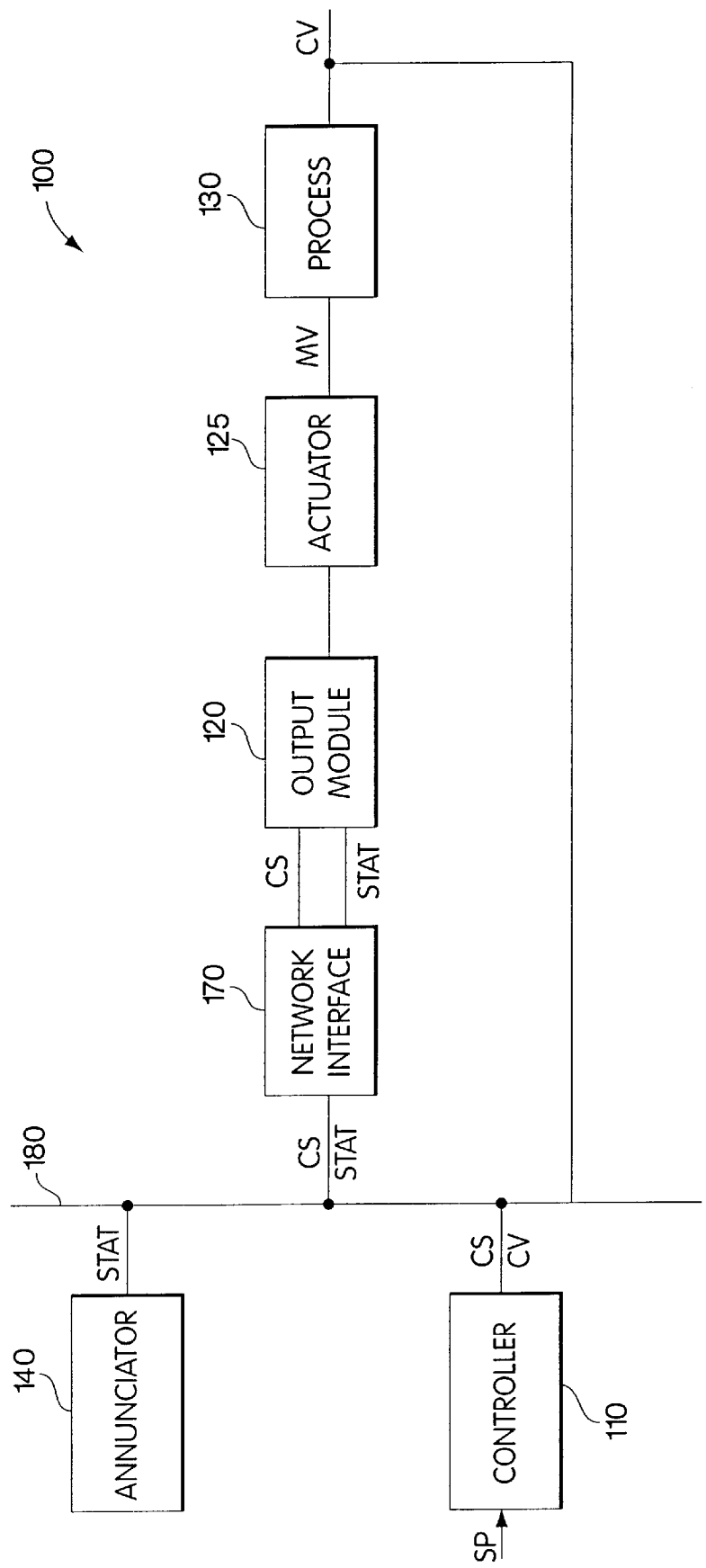
FIG. 1B shows another implementation of the feedback control system FIG. 1A in which the output module communicates with a variety of devices using a network interface.

Alternatively, the output module 120 can be connected to a network interface 170 as shown in FIG. 1B. In the configuration shown in FIG. 1B, the status signal generated by the output module 120 can be transmitted directly to an annunciator panel 140 by means of a network 180 or to any device in communication with the network 180.

Figure 2A:
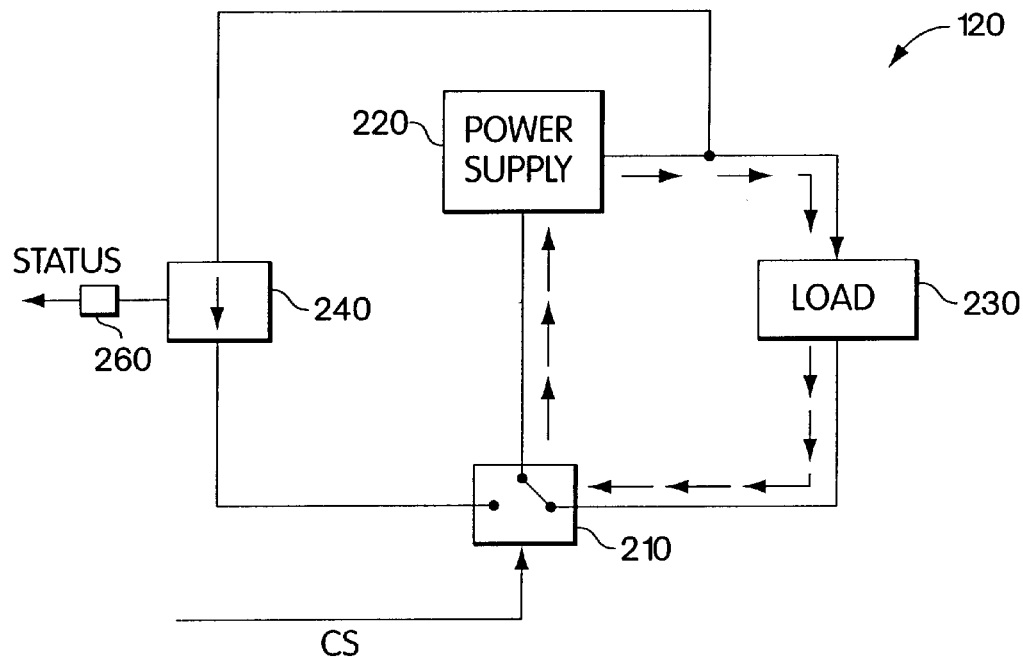
FIG. 2A shows the self-validating output module of FIG. 1A with an internal switch set to provide current to a load.
Figure 2B:
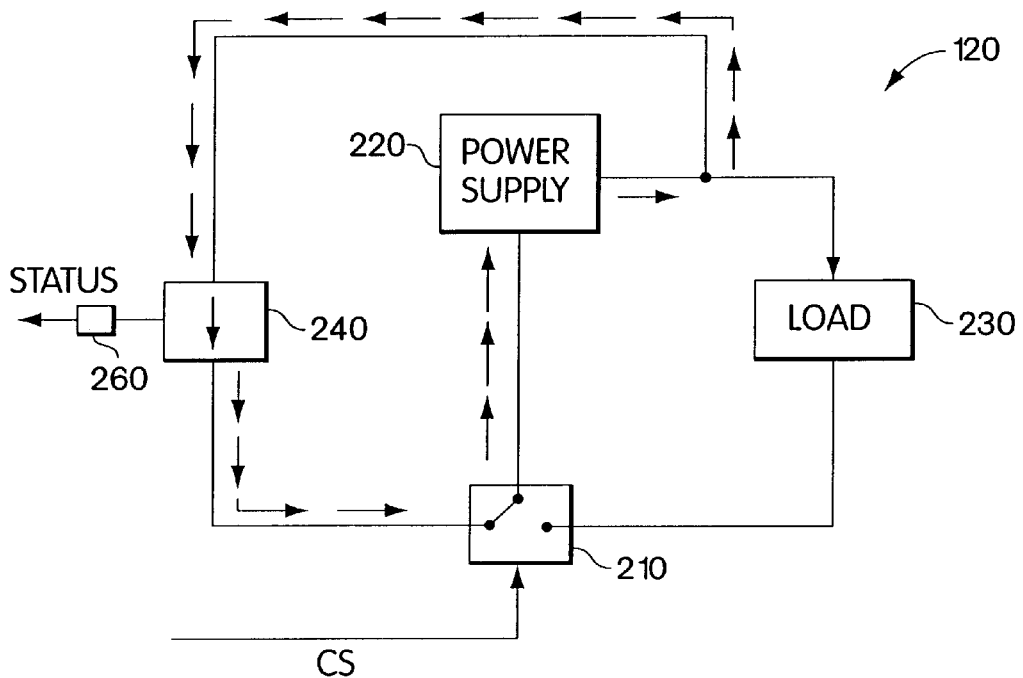
FIG. 2B shows the self-validating output module of FIG. 2A with the internal switch set to divert current from the load.

FIGS. 2A and 2B show two configurations of an output module 120 having two operating components: a power supply 220 and a switch 210 connecting a load 230 to the power supply 220. The load 230 is typically located outside the output module as shown in FIG. 2A. Generally, the load is a relay switch, a valve positioner, or other similar device contained within the actuator 125. The power supply 220 is configured to direct current to either the load 230 or to a current detector 240. The current detector 240 is coupled to a signal generator 260 for generating a signal indicative of the presence of current on the current detector 240 and making that signal available to the controller 110 (see FIG. 1).

In the configuration of FIG. 2A, the switch 210, under the control of the controller 110 (see FIG. 1) connects the power supply 220 to the load 230. As a result, current, indicated by the arrows in the figure, circulates in the loop defined by the power supply 220, the load 230, and the switch 210. The absence of current in the current detector 240 thus serves as an indicator that the switch 210 is in a position for directing current to the load 230. In response to the absence of current in the current detector 240, the signal generator 260 transmits a signal to the controller 110 confirming that the switch has connected the load 230 to the power supply 220. This signal can be a hardware signal, such as a low or high voltage output from a TTL device, or it can be a software signal suitable for transmission over a network and generated by operating on a hardware signal with a processor.

In the configuration shown in FIG. 2B, the controller 110 has directed the switch 210 to connect the power-supply 220 to the current detector 240 and to bypass the load 230. In this configuration, current, indicated by arrows in the figure, circulates in the loop defined by the power supply 220, the current detector 240, and the switch 210. The presence of current in the current detector 240 in this configuration thus serves as an indicator that the switch 210 is in a position for disconnecting the load 230 from the power supply 220. The presence of this current causes the signal generator 260 to transmit a signal to the controller 110 confirming that the switch 210 has disconnected the load 230 from the power supply 220. The signal generator 260 is typically a microprocessor in communication with a network, for example an ethernet ring, running software for transforming a hardware signal, such as the digital output of a logic circuit, into a message packet suitable for transmission on a network.

Figure 3:
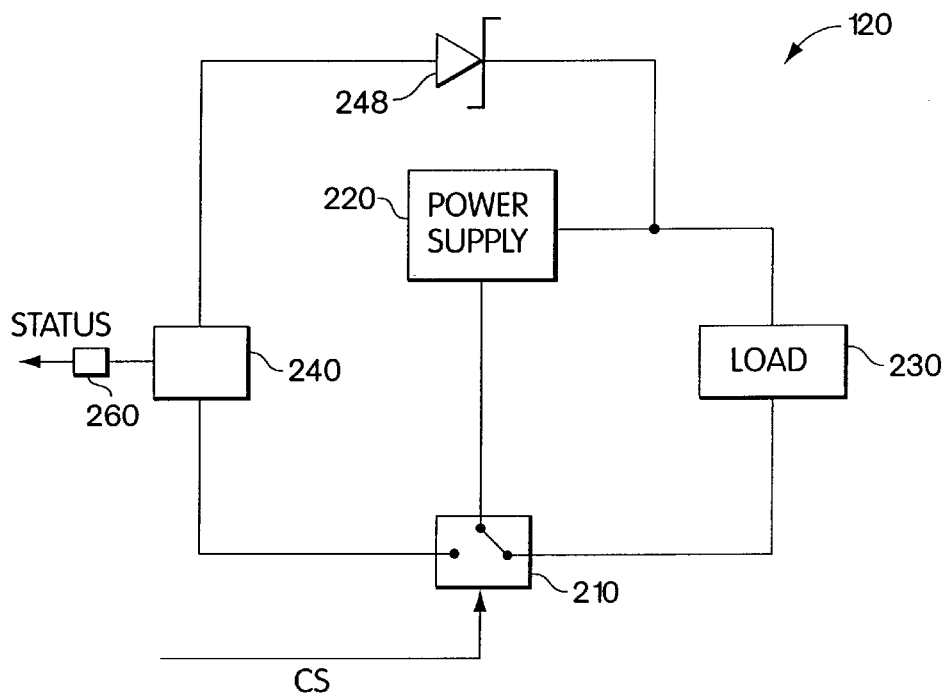
FIG. 3 shows the self-validating output module of FIGS. 2A and 2B with the addition of a zener diode disposed to allow conduction only when the power supply develops sufficient voltage.

Another embodiment of a self-validating output module, shown in FIG. 3, is similar to that illustrated in FIGS. 2A and 2B with the exception that a zener diode 248 is placed serially in the path between a power supply 220 and a current detector 240. In this embodiment, the zener diode 248 prevents current from the power supply 220 from passing through the current detector 240 unless the power supply 220 can develop a voltage in excess of the breakdown voltage of the zener diode 248. As a result, the passage of current through the current detector 240 serves to indicate that the power supply 220 is capable of providing a voltage to the load 230 at least in excess of the breakdown voltage of the zener diode 248. The embodiment shown in FIG. 3 is thus capable of monitoring the condition of the power supply 220 even if the switch 210 is set to disconnect the load 230 from the power supply 220.

Figure 4A:
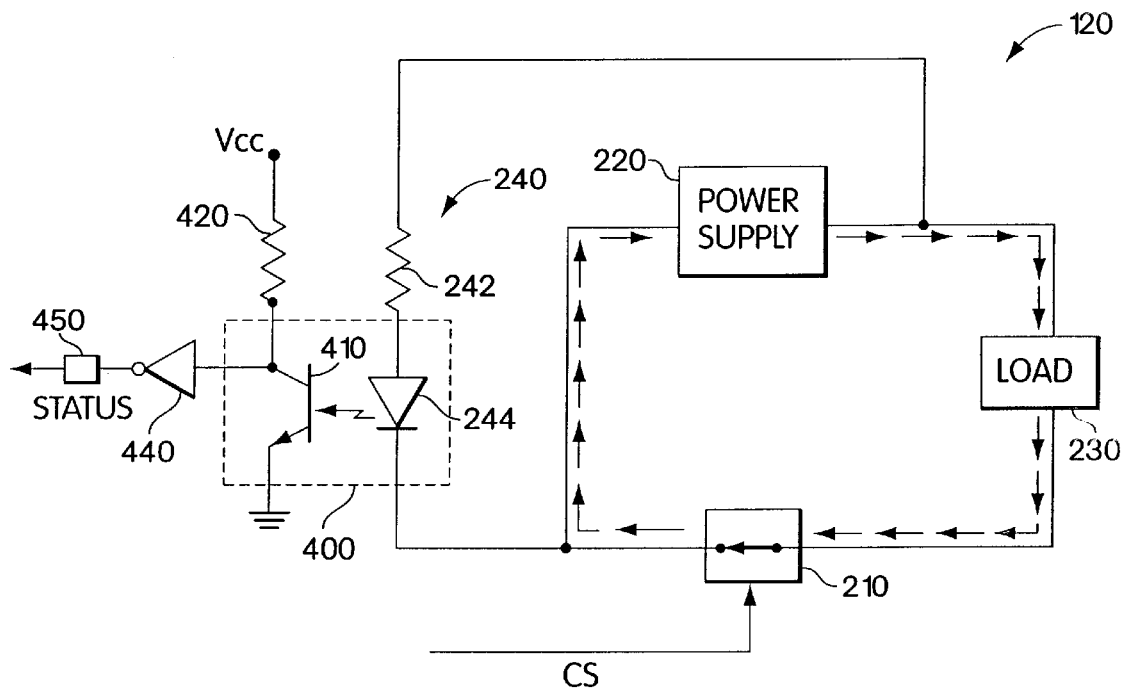
FIG. 4A shows an embodiment of the self-validating output module of FIG. 1 in which an optoisolator communicates the status of the operating components within the output module to the controller.
Figure 4B:
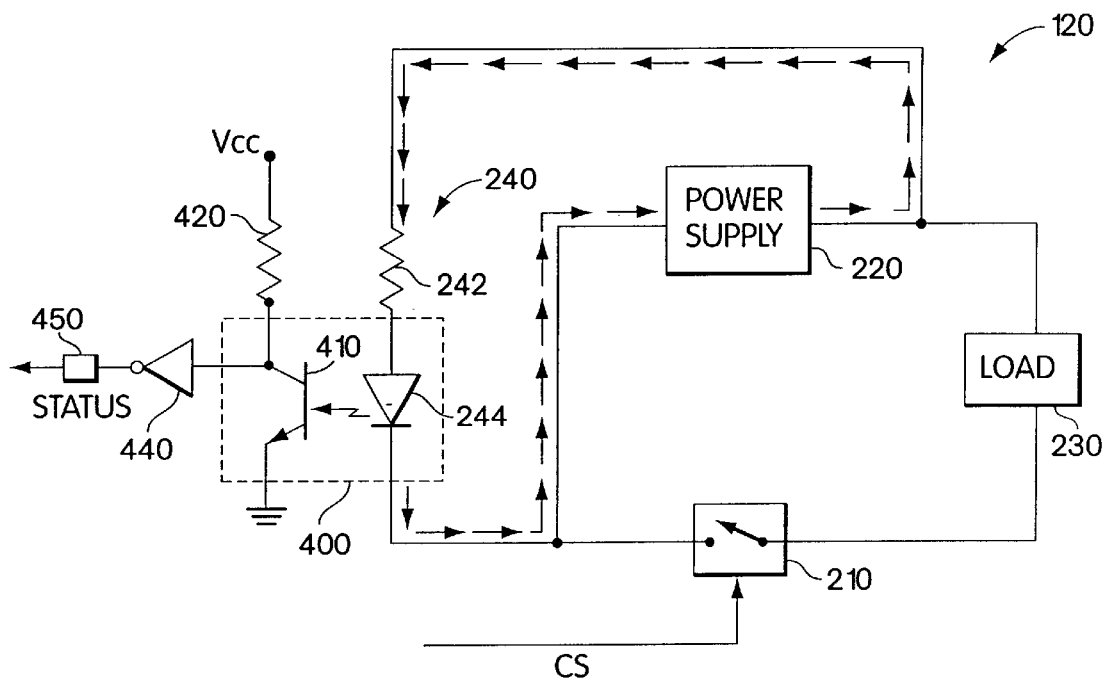
FIG. 4B shows the self-validating output module of FIG. 4A with the switch set to divert current away from the load.

FIGS. 4A and 4B show two alternate configurations of a preferred embodiment of a self-validating output module 120 according to the invention. With reference to FIG. 4A, the self-validating output module 120 includes a switch 210 connecting a load to a power supply 220. The switch 210 includes a control line connected to the controller 110 (see FIG. 1) for setting the position of the switch 210 to either the closed position shown in FIG. 4A or the open position shown in FIG. 4B. The load is typically a relay switch or a valve positioner associated with the actuator 125.

The power supply 220 is in electrical communication with a current detector 240 having a resistor 242 in series with a light-emitting diode 244 associated with an optoisolator 400. The optoisolator 400 includes a transistor 410 having a base terminal in optical communication with the light-emitting diode 242, a grounded emitter terminal, and a collector terminal connected to a voltage source and to an inverting amplifier 440. The use of an optoisolator 400 in this manner ensures that the power supply circuit remains electrically isolated while still being able to signal the presence of current flowing in the diode 240. If electrical isolation is not necessary, the light-emitting diode can be replaced by a conventional diode and a direct connection can be made between the conventional diode and the base of the transistor 410.

With the switch 210 in the closed position as shown in FIG. 4A, current flows, as indicated by the arrows in the figure, from the power supply 220, through the load 230 external to the output module 120, to the switch 210, and back to the power supply 220. Current does not return to the power supply 220 by way of the current detector 240 because the light-emitting diode 244 is oriented to prevent current from flowing in the direction toward the power supply 220. Since no current flows through the light-emitting diode 244, the transistor 410 remains off and the voltage at the collector terminal of the transistor 410 remains high. This information is then transmitted, by way of the inverting amplifier 440, to the controller 110, either directly, or by way of a microprocessor 450 that transforms it into a signal suitable for transmission across a network.

With the switch 210 in the open position, as shown in FIG. 4B, current flows, as indicated by the arrows in the figure, from the power supply 220, through the resistor 242 and the light-emitting diode 244. As a result, the transistor 410 turns on and the voltage at the collector terminal of the transistor 410 becomes low. This information is likewise transmitted, by way of the inverting amplifier 440, to the controller 110.

Figure 4C:
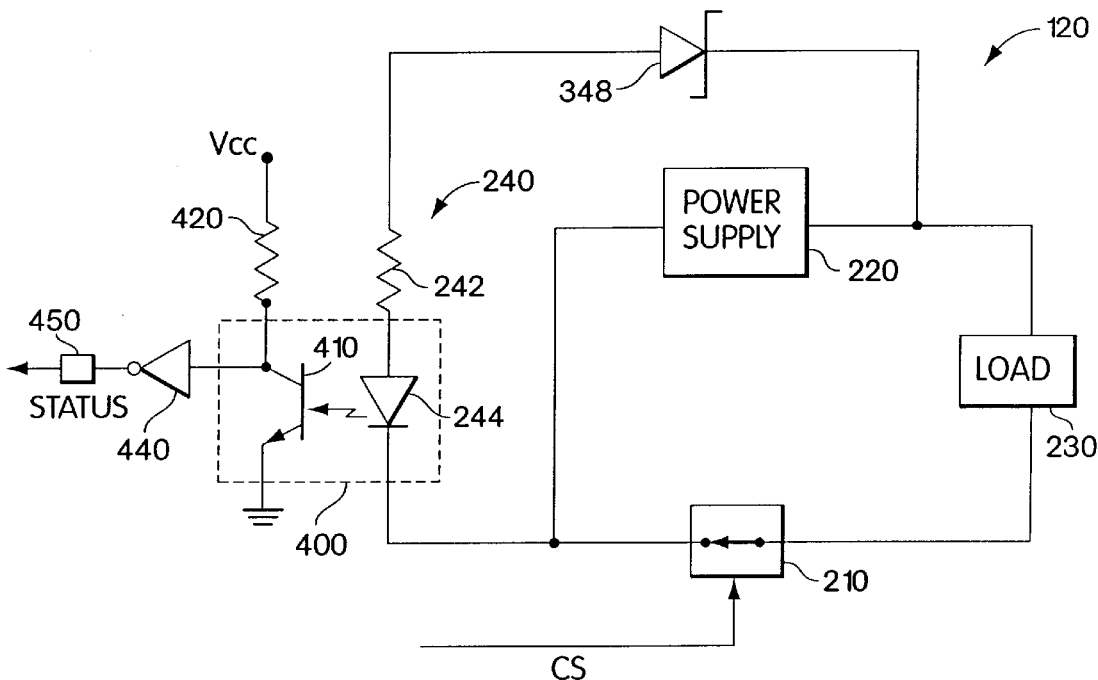
FIG. 4C shows the self-validating output module of FIG. 4A with the addition of a zener diode disposed to allow conduction only when the power supply develops sufficient voltage.

FIG. 4C illustrates the self-validating output module 120 shown in FIGS. 4A and 4B with the addition of a zener diode 348 interposed between the power supply 220 and the current detector 240. The purpose of this zener diode 250 and the operation of the circuit have already been discussed above in connection with FIG. 3.

It will thus be seen that the invention efficiently overcomes the disadvantages set forth above. Since certain changes may be made in the above constructions without departing from the scope of the invention, it is intended that all matter contained in the above description or shown in the accompanying drawings be interpreted as illustrative and not in a limiting sense.

It is also to be understood that the following claims are intended to cover all generic and specific features of the invention described herein, and all statements of the scope of the invention which as a matter of language might be said to fall therebetween. Having described the invention,

What I claim as new and secured by Letters Patent is:

1. An apparatus for providing a status signal to a controller, the apparatus comprising
   a current detector,
   an operating component configured to direct current to the current detector when the operating component is in a first state and to direct current away from the current detector when the operating component is in a second state, and
   a signal generator responsive to whether current flows through the current detector for generating a status signal indicative of whether the operating component is in the first state or the second state and providing the status signal to the controller.

2. The apparatus of claim 1 wherein the operating component comprises a switch, the first state is a state in which the switch diverts current from a power supply to a load and away from the current detector, and the second state is a state in which the switch diverts current from the power supply to the current detector and away from the load.

3. The apparatus of claim 1 wherein the operating component is a power supply connected to a load, the first state is a state in which the power supply supplies sufficient power to drive the load and the second state is a state in which the power supply fails to supply sufficient power to drive the load.

4. The apparatus of claim 2 wherein the load comprises a relay switch.

5. The apparatus of claim 1 wherein the current detector comprises a unidirectional current carrier.

6. The apparatus of claim 5 wherein the unidirectional current carrier comprises a diode.

7. The apparatus of claim 6 wherein the diode is a light-emitting diode.

8. The apparatus of claim 5 further comprising a voltage detector configured to detect a voltage in excess of a threshold when the operating component is in the first state.

9. The apparatus of claim 8 wherein the voltage detector comprises a zener diode in series with the current detector.

10. The apparatus of claim 1 wherein the signal generator is an optoisolator responsive to the presence of current in the current detector.

11. The apparatus of claim 6 wherein the signal generator comprises a transistor having a control terminal in electrical communication with the diode.

12. The apparatus of claim 7 wherein the signal generator comprises a transistor having a control terminal in optical communication with the light-emitting diode.

13. The apparatus of claim 1 further comprising a processor for transforming the status signal into a message for transmission on a network.

14. In a process control system, an output module for transmitting a status signal to a controller, the status signal being indicative of whether power is provided to a load, the apparatus comprising
    a current detector,
    a power supply in electrical communication with the load through a first connection and in electrical communication with the current detector through a second connection,
    a switch connecting the power supply to the load, the switch having a first state in which current flows between the power supply and the load and the flow of current between the power supply and the current detector is interuted, and a second state in which the flow of current between the power supply and the load is interupted and current flows from the power supply to the current detector,
    a signal generator responsive to whether current flows through the current detector for generating a status signal indicative of whether current flows through the current detector and providing the status signal to the controller.

15. A method for providing a status signal to a process controller, the status signal being indicative of the status of an operating component, the method comprising
    directing current to a current detector and away from a load when the operating component is in a first state,
    directing current to the load and away from the current detector when the operating component is in a second state,
    generating a status signal on the basis of whether current flows through the current detector, the status signal being indicative of whether the operating component is in the first state or in the second state, and
    providing the status signal to the controller.

16. The method of claim 15 wherein directing current to the load comprises placing a switch in a first position in which current from a power supply is diverted to the load and away from the current detector.

17. The method of claim 15 wherein directing current to the current detector comprises placing a switch in a second position in which current from a power supply is diverted to the current detector and away from the load.

18. The method of claim 15 wherein directing current to the load comprises directing current to a relay switch.

19. The method of claim 15 wherein directing current to the current detector comprises directing the current to a unidirectional current carrier.

20. The method of claim 19 wherein directing the current to a unidirectional current carrier comprises directing the current to a diode.

21. The method of claim 20 wherein directing the current to a diode comprises directing the current to a light emitting diode.

22. The method of claim 15 further comprising transforming the status signal into a message suitable for transmission on a computer network.

23. The method of claim 19 further comprising passing the current through a voltage detector configured to detect voltage in excess of a threshold when the operating component is in the first state.

24. The method of claim 23 wherein passing the current through a voltage detector comprises providing a zener diode in series with a current detector.

25. In a process control system, a method for providing a status signal to a controller, the status signal being indicative of whether power is provided to a load, the method comprising
    directing current from a power supply through a switch having a first state in which the switch directs current through a load and away from a current detector and a second state in which the switch directs current through a current detector and away from the load,
    determining whether current flows through the current detector,
    generating a status signal indicative of whether current flows through the current detector, and
    providing the status signal to the controller.

26. A process control system having an output module in communication with a controller, wherein the output module comprises:
    a current detector,
    an operating component having a first state and a second state, and
    a signal generator responsive to whether current flows through the current detector for generating a status signal indicative of whether the operating component is in the first state or the second state and providing the status signal to the controller.

27. The process control system of claim 26 wherein the operating component comprises a power supply connected to a load, the first state is a state in which the power supply supplies sufficient power to drive the load, and the second state is a state in which the power supply fails to supply sufficient power to drive the load.

28. The process control system of claim 27 wherein the load comprises a relay switch.

29. The process control system of claim 26 wherein the operating component comprises a switch, the first state is a state in which the switch diverts current from a power supply to a load and away from the current detector, and the second state is a state in which the switch diverts current from the power supply to the current detector and away from the load.

30. The process control system of claim 29 wherein the load comprises a relay switch.

31. The process control system of claim 29 wherein the current detector comprises at least one of a unidirectional current carrier, a diode, and a light-emitting diode.

32. The process control system of claim 31 further comprising a voltage detector configured to detect a voltage in excess of a threshold when the operating component is in the first state.

33. The process control system of claim 32 further comprising a zener diode in series with the current detector.

34. The process control system of claim 26 wherein the signal generator is an optoisolator responsive to the presence of current in the current detector.

35. The process control system of claim 31 wherein the signal generator comprises a transistor having a control terminal in electrical communication with a diode.

36. The process control system of claim 31 wherein the signal generator comprises a transistor having a control terminal in optical communication with a light-emitting diode.

37. The process control system of claim 26 further comprising a processor for transforming the status signal into a message for transmission on a network.

* * * * *

UNITED STATES PATENT AND TRADEMARK OFFICE
CERTIFICATE OF CORRECTION

PATENT NO. : 6,507,283 B1 Page 1 of 1
DATED : January 14, 2003
INVENTOR(S) : James Calvin It is certified that error appears in the above-identified patent and that said Letters Patent is hereby corrected as shown below:

Column 7,
Lines 45 and 47, replace "interuted" with -- interrupted --

Signed and Sealed this

Eleventh Day of March, 2003

JAMES E. ROGAN
*Director of the United States Patent and Trademark Office*